United States Patent [19]

Takeguchi

[11] Patent Number: 4,720,818
[45] Date of Patent: Jan. 19, 1988

[54] SEMICONDUCTOR MEMORY DEVICE ADAPTED TO CARRY OUT OPERATION TEST

[75] Inventor: Tetsuji Takeguchi, Kawasaki, Japan

[73] Assignee: Fujitsu Limited, Kawasaki, Japan

[21] Appl. No.: 875,090

[22] Filed: Jun. 17, 1986

[30] Foreign Application Priority Data

Jun. 17, 1985 [JP] Japan .................................. 60-131591

[51] Int. Cl.⁴ .............................................. G11C 29/00
[52] U.S. Cl. ................................................... 365/201
[58] Field of Search ...................... 365/201, 200; 371/3

[56] References Cited

U.S. PATENT DOCUMENTS 4,456,980 6/1984 Yamada et al. ...................... 365/200

Primary Examiner—James W. Moffitt
Attorney, Agent, or Firm—Staas & Halsey

[57] ABSTRACT

In order to facilitate a test of the operations of a semiconductor memory device, the semiconductor memory device includes a line selection checking unit coupled to a cell matrix and column gates to form a logic gate circuit unit consisting of a plurality of transistors, the gates of the transistors being connected to word lines or bit lines. The line selection checking unit has a voltage or current detection portion connected to a pad for detecting an output voltage or current of the line selection checking unit.

18 Claims, 6 Drawing Figures

| Fig. 2A | Fig. 2B |

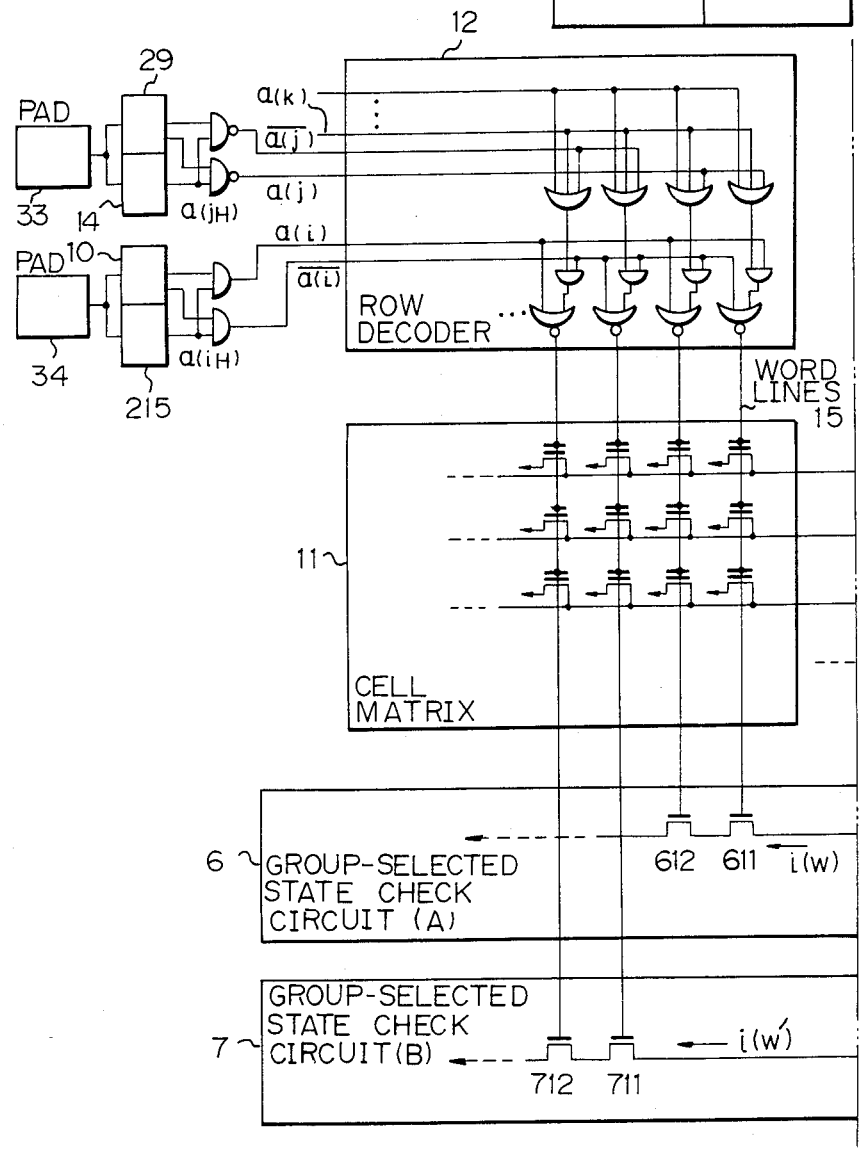

SEMICONDUCTOR MEMORY DEVICE ADAPTED TO CARRY OUT OPERATION TEST

BACKGROUND OF THE INVENTION

1. Field of the Invention

The present invention is related to a semiconductor memory device adapted to carry out a test operation of the semiconductor memory device. The device according to the present invention is applicable to, for example, an EPROM.

2. Description of the Related Arts

In general, testing a semiconductor memory device upon manufacture is carried out by an IC tester and a probe. Among the various test modes used are a mode wherein all of the word lines or bit lines are selected, and a mode wherein a group of the word lines or bit lines is selected. These all-selection mode or group-selection mode tests are adopted to enhance the testing speed of the semiconductor memory device. The tests according to the above modes are usually carried out according to an all-selection or group-selection operation by programs stored in the IC tester.

However, in the prior art, in tests employing the all-selection or group-selection modes, usually the confirmation of whether or not the all-selection or group-selection signals are actually supplied to the device to be tested is not carried out. Accordingly, confirmation of whether or not an all-selection or a group-selection actually takes place is not carried out.

In addition, in the prior art, the selection of all of the word or bit lines, or the selection of a group of word or bit lines is confirmed by information obtained from the memory cell array. During this confirmation operation, however, it is necessary to store special information for the test in the memory cell and to read the stored special information. Such processes are complicated and inconvenient. Thus, a satisfactory method or system has not been established for realizing a reliable test including a complete test of the all-selection or group-selection of lines of a semiconductor memory device.

SUMMARY OF THE INVENTION

It is an object of the present invention to provide an improved semiconductor memory device adapted to perform a testing operation of the semiconductor memory device in which a reliable test, including a complete test of an all-selection or group-selection of lines of a semiconductor memory device, is carried out.

According to the present invention, there is provided a semiconductor memory device adapted to perform a testing operation of the semiconductor memory device. The semiconductor memory device includes a cell matrix having a memory cell array, rows of word lines, and columns of bit lines. Column gates are connected to the columns of bit lines. Row and column decoders are provided for decoding signals for selecting all of the word or bit lines or selecting a group of the word or bit lines. A plurality of pads provide input or output terminals of the semiconductor memory device. A line selection checking is coupled to the cell matrix and the column gates to form a logic gate circuit unit consisting of a plurality of transistors, and the gates of the transistors are connected to the word lines or bit lines. The line selection checking unit has a voltage or current detection portion connected to one of the pads for detecting the output voltage or current of the line selection checking unit.

DESCRIPTION OF THE PREFERRED EMBODIMENTS

Before describing the preferred embodiments of the present invention, the fundamental structure of the device by which the operation according to the present invention is realized will be described with reference to FIG. 1.

Figure 1:
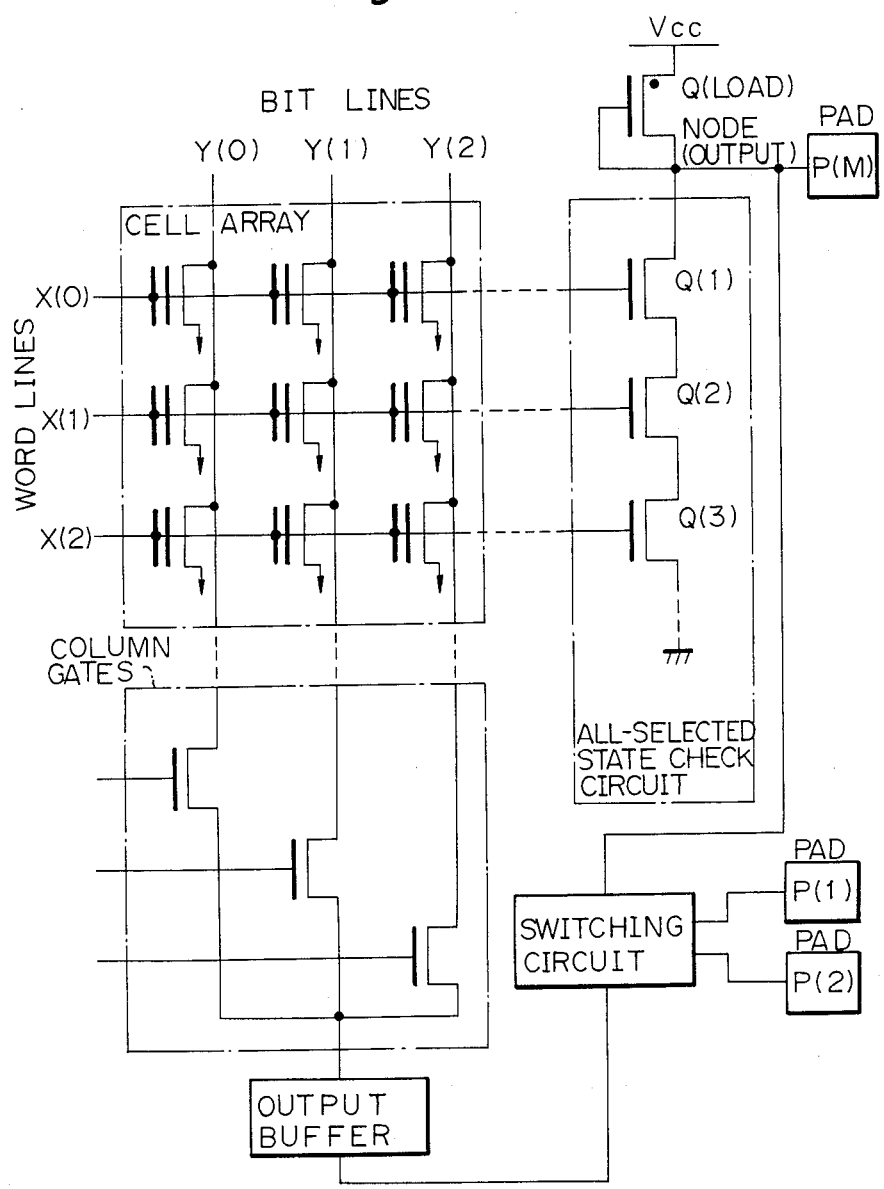
FIG. 1 is a basic circuit diagram according to the present invention.

The device of FIG. 1 includes an NOR type memory cell array having word lines $X(0)$, $X(1)$, $X(2)$, ..., bit lines $Y(0)$, $Y(1)$, $Y(2)$, ..., column gates, an output buffer circuit, a NAND circuit consisting of transistors $Q(1)$, $Q(2)$, $Q(3)$, ..., and a depletion type load transistor $Q(LOAD)$ having a diode connection. The output node NODE(OUTPUT) is connected to a specially provided pad $P(M)$. Alternatively, the output node NODE(OUTPUT) is connected through the switching circuit to an existing pad $P(1)$ for delivering the information in the output node NODE(OUTPUT) through the existent pad $P(1)$. In normal operation, the internal circuits are connected through the switching circuit to the pad $P(1)$. During a test, a signal which does not appear at the pad $P(2)$ during a normal operation, such as a high voltage signal or the like, is applied to the pad $P(2)$ so that the switching circuit switches the internal circuits including the memory cell array, the column gates, and the output buffer circuit to a high impedance state. The switching circuit switches the information of the output node NODE(OUTPUT) to the pad $P(1)$.

Instead of the above-described monitoring of the potential of the output node NODE(OUTPUT), it is possible to confirm the all-selected state by monitoring the current passing through the transistors $Q(1)$, $Q(2)$, $Q(3)$, .... It should be noted that this current flows only in the all-selected state.

Consequently, in the simultaneous plural word line selection mode or in the simultaneous entire word line selection, if at least one bit or word line is not selected, either the potential of the output node NODE(OUTPUT) of the NAND circuit becomes HIGH, or a current does not pass through the NAND circuit. Thus, the simultaneous plural word line selection or the simultaneous entire word line selection can be easily confirmed by monitoring the potential of the output node of the NAND circuit, or the presence or absence of a current passing through the NAND circuit.

Figures 2, 2A:
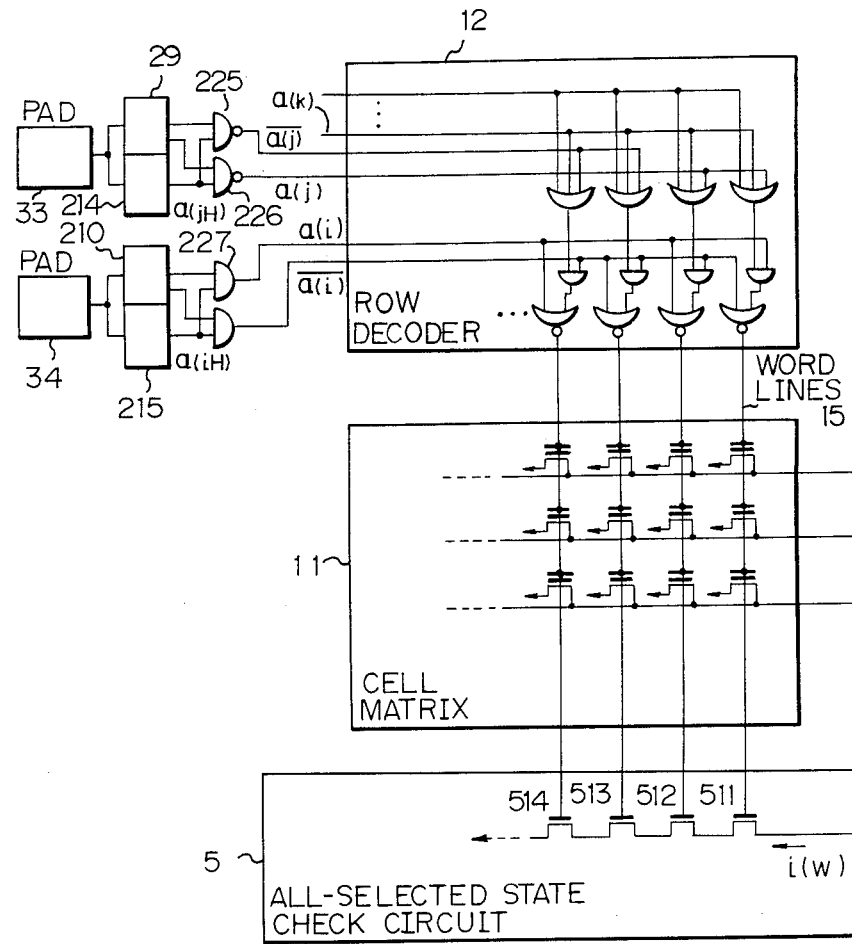
FIG. 2 (FIGS. 2A and 2B) is a semiconductor memory device according to a first embodiment of the present invention.
Figure 2B:
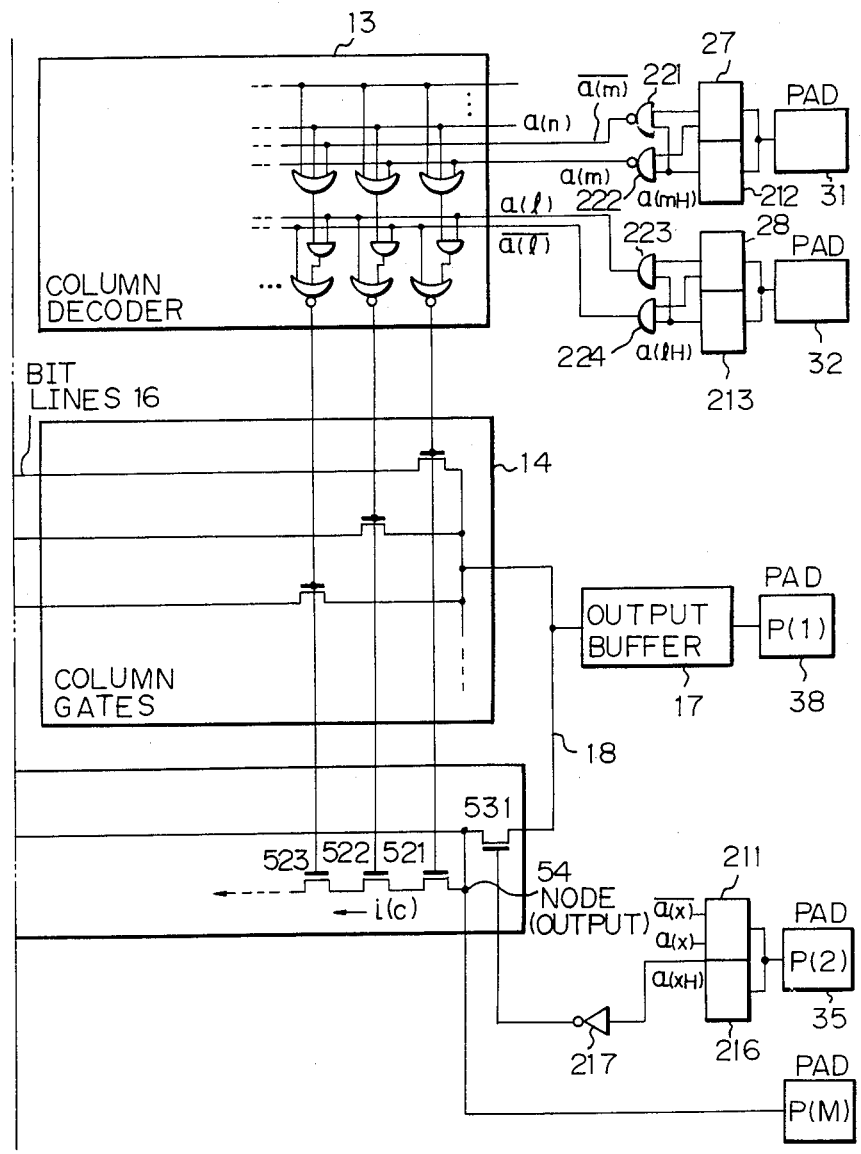

A semiconductor memory device according to a first embodiment of the present invention is shown in FIG. 2. The device of FIG. 2 includes a cell matrix 11, a row decoder 12, a column decoder 13, column gates 14, word lines 15, bit lines 16, an output buffer 17, a bus line 18, address buffers 27, 28, 29, 210, and 211, high voltage detection circuits 212, 213, 214, 215, and 216, an inverter 217, column address input pads 31 and 32, row address input pads 33 and 34, an address input pad 35, an output pad 38, and an all-selected state check circuit 5.

The all-selected state check circuit 5 includes N channel MOS field effect transistors 511, 512, 513, 514 . . . , N channel MOS field effect transistors 521, 522, 523, . . . , and an N channel MOS field effect transistor 531.

The drain of the transistor 531 is connected to the bus line 18 which is connected to the column gates 14. The source of the transistor 531 is connected to the series connection of the transistors 521, 522, 523, . . . , and the gates of the transistors 521, 522, 523, . . . are connected to the selection signal lines, that is, the column decoder output lines of the column gates 14. The source of the transistor 531 is also connected to the series connection of the transistors 511, 512, 513, 514, . . . . The gates of the transistors 511, 512, 513, 514, . . . are connected to the word lines.

The current i(C) passing through the transistors 521, 522, 523, . . . and the current i(W) passing through the transistors 511, 512, 513, 514, . . . is detected by monitoring the output pad 38. Alternatively, it is possible to monitor the potential of the output node 54 of the all-selected state check circuit 5.

In the usual operation state, a high voltage is not applied to the pads 31, 32, 33, 34, and 35, and accordingly, the potential of the outputs a (mH), a(lH), a(jH), a(iH), and a(xH) remain HIGH. As usual, address signals are supplied to the column decoder 13 or the row decoder 12 through address buffers so that data can be written in and read from the cell matrix 11.

The operation of the testing device of FIG. 2 will now be described. First, the operation for checking the all-selected state of the word lines is described, with the use of a probe and an IC tester.

(i) It is assumed that the potential of the output a(mH) of the high voltage detection circuit 212 is HIGH. When a high voltage is applied to the pad 31, the potential of the output a(mH) of the high voltage detection circuit 212 becomes low, and the potentials of both outputs of the NAND gates 221 and 222 become HIGH. Hence, all the outputs of the column decoder 13 become LOW. Accordingly, all the column gates 14 become OFF, and all the bit lines become unselected. This condition can be confirmed by the absence of current through the bus line 18. Here, it is assumed that a memory cell allows a current to pass therethrough when this memory cell is selected.

(ii) A high voltage is also supplied to the pad 34, and accordingly, the potential of the output a(iH) of the high voltage detection circuit 215 becomes LOW. (Here, it is assumed that the potential of the output a(iH) is usually HIGH.) The potentials of both the outputs $\bar{a})/$ and a(i) become LOW, and thus the potentials of the outputs of the row decoder 12 all become HIGH. Accordingly, all the word lines 15 become selected state. In this case, the bit lines 16 are all in the unselected state, and accordingly a current does not flow through the bus line.

(iii) When a high voltage is applied to the pad 35, the potential of the output a(xH) of the high voltage detection circuit 216 becomes LOW. (Here, it is assumed that the potential of the output a(xH) is usually HIGH.) The transistor 531 as a transfer gate becomes ON, and thus, current flows through the bus line 18 and therefore, the bit lines 16 are connected to the all-selected state check circuit 5.

When the all-selected operation of the word lines is carried out as usual, all of the transistors 511, 512, 513, 514, . . . having the word lines 15 as gate inputs become ON, and thus the current i(W) flows. Therefore, by detecting the current passing through the bus line 18, the actual occurrence of an all-selection state of the word lines is confirmed.

Next, the operation for checking the all-selected state of the bit lines is described.

(i) Where the column gates 14 are selected, a confirmation of the selection of the bit lines is carried out. Thus, by confirming the selection of all of the column gates 14, it is possible to confirm the selection of all of the bit lines.

(ii) A high voltage is supplied to the pad 33, and accordingly, the potential of the output a(jH) of the high voltage detection circuit 214 becomes LOW. (Here, it is assumed that the potential of the output a(jH) is usually HIGH). The potentials of the outputs a(j) and $\bar{a})/$ become HIGH, and accordingly, all of the word lines 15 become the unselected state. This state can be confirmed by detecting an absence of current through each of the bit lines 16.

(iii) A high voltage is also supplied to the pad 32, and accordingly the potential of the output a(lH) becomes LOW. (Here, it is assumed that the potential of the output a(lH) is usually HIGH.) Therefore, the potentials of the output $\bar{a})/$ and the output a(l) become LOW. Accordingly, all of the bit lines 16 become the selected state, that is, all of the column gates 14 become the selected state.

In this case, all of the word lines 15 are in the unselected state, and thus a current does not flow through the bus line 18.

(iv) Further, a high voltage is supplied to the pad 35, and thus the potential of the output a(xH) of the high voltage detection circuit 216 becomes LOW. Accordingly, the transistor 531 turns ON, and the bus line 18 is connected to the all-selected state check circuit 5.

When the operation of the device is as usual and all of the bit lines 16, that is all of the column gates 14, are selected, all of the transistors 521, 522, 523, . . . having the input signals for the column gates 14 as the gate input signals thereof turn ON, so that the current i(C) passes through the transistors 521, 522, 523, . . . .

Thus, by detecting the current i(C) passing through the bus line 18, it is possible to confirm the selection of all of the bit lines 16.

Figure 3B:
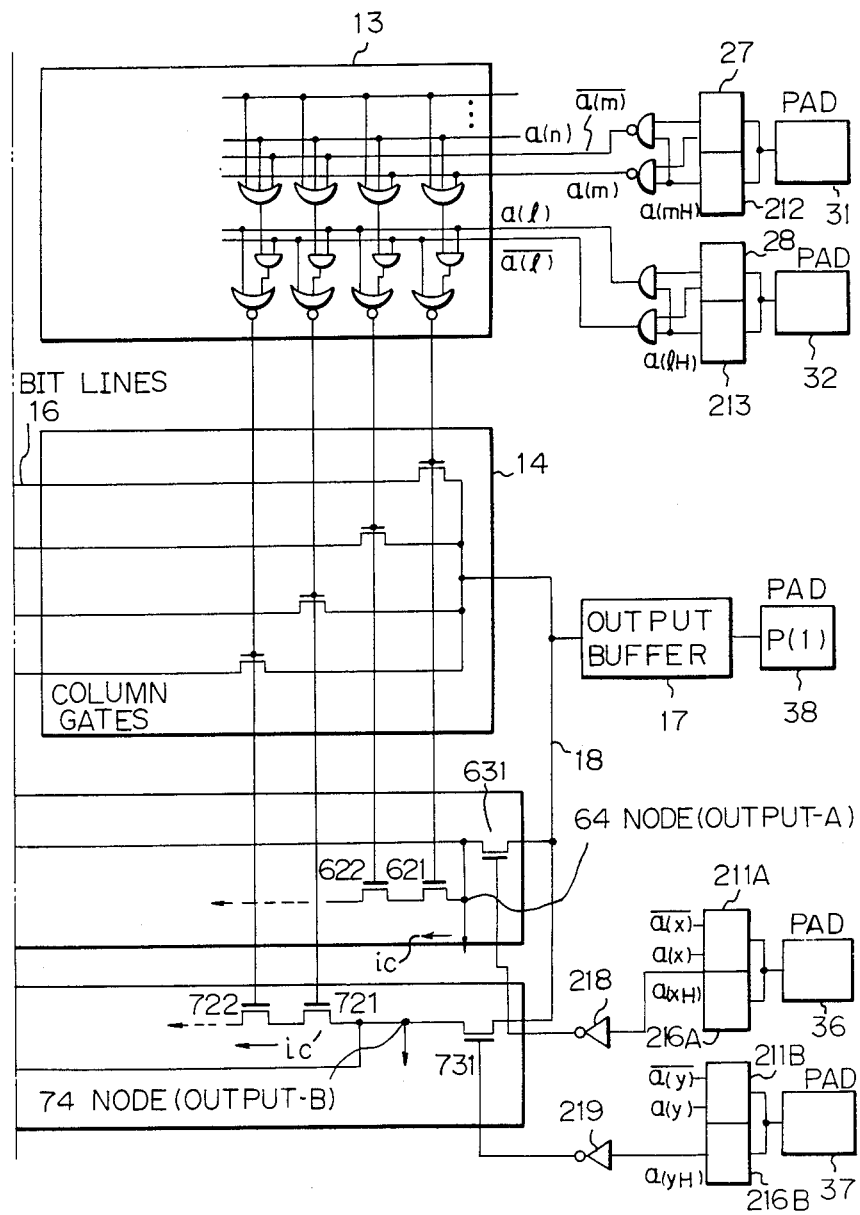
FIG. 3 (FIGS. 3A and 3B) is a semiconductor memory device according to a second embodiment of the present invention.

A semiconductor memory device according to a second embodiment of the present invention is shown in FIG. 3. In the device of FIG. 3, the confirmation of a simultaneous selection of half all of the word lines or half of all the bit lines is carried out.

In FIG. 3, a group-selected state check circuit(A)6 for one half of all the word lines and one half of all the bit lines, and a group-selected state check circuit(B)7 for the other half of all the word lines and the other half of all the bit lines are provided. The gate of the transistor 631, which forms a load for the transistors 611, 612, . . . , and 621, 622, . . . , is connected through the inverter 218 to the high voltage detection circuit 216A for the pad 36. The gate of the transistor 731, which forms a load for the transistors 711, 712, . . . , and 721, 722, . . . , is connected through the inverter 219 to the high voltage detection circuit 216B for the pad 37.

Under the condition that a high voltage is applied to the pad 36, the confirmation of the selection of one half of all the bit lines or one half of all the word lines is carried out by detecting the potential of the node 64. Conversely, under the condition that a high voltage is applied to the pad 37, the confirmation of the selection of the other half of all the bit lines or the other half of all the word lines is carried out by detecting the potential of the node 74.

Figure 4:
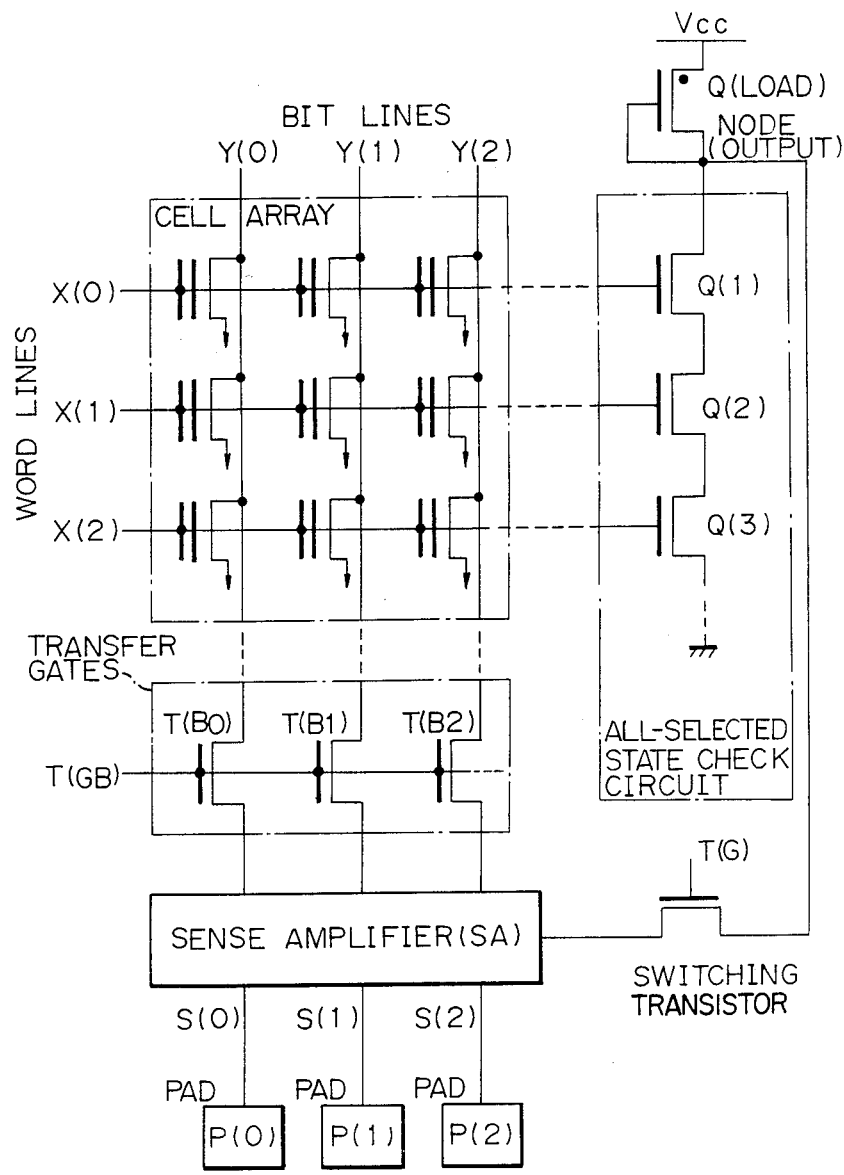
FIG. 4 is a semiconductor memory device according to a third embodiment of the present invention.

A semiconductor memory device according to a third embodiment of the present invention is shown in FIG. 4. FIG. 4 is a case where the confirmation of the selection of all the word lines is carried out. The device of FIG. 4 includes a NOR type memory cell array having word lines X(0), X(1), X(2), ..., bit lines Y(0), Y(1), Y(2), ..., transfer gates T(B0), T(B1), T(B2), ..., a NAND circuit consisting of transistors Q(1), Q(2), Q(3), ..., and a depletion type load transistor Q(LOAD) having a diode connection, a sense amplifier, a switching transistor T(G), and nodes P(0), P(1), P(2) ....

The device of FIG. 4 carries out the detection of the potential of the output node NODE(OUTPUT). The switching transistor is normally in an OFF state, and the transfer gates T(B0), T(B1), T(B2), ... are normally in an ON state.

The operation of the device of FIG. 4 will now be described. First, all of the bit lines Y(0), Y(1), Y(2), ... are in a unselected state, and all of the transfer gates T(B0), T(B1), T(B2), ... are in an OFF state. Then, the switching transisor T(G) becomes ON, and the output node NODE(OUTPUT) is connected to the sense amplifier. Therefore, for example, the information regarding the potential of the output node NODE(OUTPUT) appears at the output S(0) of the sense amplifier. Accordingly, it is possible to confirm the selection of all the word lines by detecting the information appearing at the existing pad P(0) connected to the output S(0).

Similarly, it is possible to carry out the confirmation of the selection of all the bit lines by providing a NAND circuit for the bit line side, that is the column gate side. In this case, a column gate input signal forms a gate input signal.

In the device of FIG. 4, the generation of control signals for the transistors T(B0), T(B1), T(B2), ..., and T(G), the selection of all the word lines and non-selection of all the bit lines, and the selection of all the bit lines and non-selection of all of the word lines can be controlled by the application of a high voltage to the existing pads for which additional modes are provided. In this case, high voltage detection circuits are provided for each of the existing pads.

What is claimed is:

1. A semiconductor memory device, operatively connected to receive selection signals, for performing a test operation for testing said semiconductor memory device, comprising:
    a cell matrix having a memory cell array including:
        rows of word lines; and
        columns of bit lines intersecting said rows of word lines;
        column gates connected to said columns of bit lines;
    row and column decoders, operatively connected to said cell matrix, for receiving and decoding the selection signals and for performing a selection of all of one of said rows of word lines and columns of bit lines;
    a plurality of pads, operatively connected to said row and column decoders, for providing one of input and output terminals for said semiconductor memory device; and
    line selection checking means, operatively connected to said cell matrix and said column gates, for forming logic gate circuit means including a plurality of transistors, the gates of said transistors being respectively connected to one of said rows of word lines and columns of bit lines through said column gates, and including one of a voltage and current detection portion operatively connected to one of said plurality of pads for detecting one of an output voltage and current of said line selection checking means.

2. A device according to claim 1, wherein said line selection checking means is a line selection checking circuit for checking the selection of all of one of said rows of word lines and columns of bit lines.

3. A device according to claim 2, wherein said line selection checking means comprises:
    a first series sequence of transistors, operatively connected to said rows of word lines, for receiving gate signals from all of said word lines;
    a second series of transistors, operatively connected to said columns of bit lines, for receiving gate signals from all of said bit lines, said first and second series sequences of transistors connected in parallel; and
    a switching transistor operatively connected to said first and second series sequences of transistors.

4. A device according to claim 3, further comprising:
    a bus line operatively connected to an electrode of said switching transistor; and
    an output buffer circuit connected between said bus line and one of said plurality of output pads.

5. A device according to claim 3, further comprising:
    a high voltage detection circuit operatively connected to one of said plurality of pads; and
    an inverter operatively connected between said high voltage detection circuit and a gate of said switching transistor.

6. A device according to claim 1, wherein said line selection checking means includes a plurality of line selection checking circuits, each of said line selection checking circuits checking the selection of a group of one of said rows of word lines and columns of bit lines.

7. A device according to claim 6, wherein each of said plurality of line selection checking circuits comprises:
    a first series sequence of transistors, operatively connected to said rows of word lines, for receiving gate signals from a group of said word lines;
    a second series sequence of transistors, operatively connected to said columns of bit lines, for receiving gate signals from a group of said bit lines, said first and second series sequences of transistors connected in parallel; and
    a switching transistor operatively connected to said first and second series sequences of transistors.

8. A device according to claim 7, further comprising:
    an output buffer operatively connected to one of said plurality of pads;
    a bus line operatively connected between said output buffer and an electrode of said switching transistor.

9. A device according to claim 7, further comprising:
    a high voltage detection circuit operatively connected to one of said plurality of pads; and
    an inverter operatively connected between said high voltage detection circuit and a gate of said switching transistor.

10. A semiconductor memory device, operatively connected to receive selection signals, for performing a test operation for testing said semiconductor memory device, comprising:
- a cell matrix having a memory cell array including:
  - rows of word lines; and
    - columns of bit lines intersecting said rows of word lines;
- transfer gates operatively connected to said columns of bit lines;
- a sense amplifier operatively connected to said transfer gates;
- row and column decoders, operatively connected to said rows of word lines and columns of bit lines, for receiving and decoding the selection signals and for carrying out a selection of all of one of said rows of word lines and columns of bit lines;
- a plurality of pads, operatively connected to said row and column decoders, for providing one of input and output terminals to said semiconductor memory device, a number of said pads being connected to said sense amplifier; and
- line selection checking means, operatively connected to said cell matrix, for forming logic gate circuit means including a plurality of transistors having gates respectively, operatively connected to one of said rows of word lines and columns of bit lines, said line selection checking means including one of a voltage and current detection portion for detecting an output voltage of said line selection checking circuit.

11. A device according to claim 10, wherein said line selection checking means includes an output node, said device further comprising a switching transistor operatively connected between said output node of said line selection checking means and said sense amplifier.

12. A semiconductor memory device, operatively connected to receive selection signals, for performing a test operation for testing said semiconductor memory device, comprising:
- a cell matrix having a memory cell array including:
  - rows of word lines; and
    - columns of bit lines intersecting said rows of word lines;
- column gates connected to said columns of bit lines;
- row and column decoders, operatively connected to said cell matrix, for receiving and decoding the selection signals and for performing a selection of a group of one of said word rows of word lines and columns of bit lines;
- a plurality of pads, operatively connected to said row and column decoders, for providing one of input and output terminals for said semiconductor memory device; and
- line selection checking means, operatively connected to said cell matrix and said column gates, for forming logic gate circuit means including a plurality of transistors having gates connected to one of said group of said rows of word lines and columns of bit lines selected by said row and column decoders, and including one of a voltage and current detection portion operatively connected to one of said plurality of pads for detecting one of an output voltage and current of said line selection checking means.

13. A device according to claim 12, wherein said line selection checking means is a line selection checking circuit for checking the selection of said group of said rows of word lines and columns of bit lines.

14. A device according to claim 13, wherein said line selection checking means comprises:
- a first series sequence of transistors, operatively connected to said rows of word lines, for receiving gate signals from all of said word lines;
- a second series sequence of transistors, operatively connected to said columns of bit lines, for receiving gate signal from all of said bit lines, said first and second series sequences of transistors connected in parallel; and
- a switching transistor operatively connected to said first and second series sequences of transistors.

15. A device according to claim 14, further comprising:
- a bus line operatively connected to an electrode of said switching transistor; and
- an output buffer circuit connected between said bus line and one of said plurality of output pads.

16. A device according to claim 14, further comprising:
- a high voltage detection circuit operatively connected to one of said plurality of pads; and
- an inverter operatively connected between said high voltage detection circuit and a gate of said switching transistor.

17. A semiconductor memory device, operatively connected to receive selection signals, for performing a test operation for testing said semiconductor memory device, comprising:
- a cell matrix having a memory cell array including:
  - rows of word lines; and
    - columns of bit lines intersecting said rows of word lines;
- transfer gates operatively connected to said columns of bit lines;
- a sense amplifier operatively connected to said transfer gate;
- row and column decoders, operatively connected to said rows of word lines and columns of bit lines, for receiving and decoding the selection signals and for carrying out a selection of a group of one of said rows of word lines and columns of bit lines;
- a plurality of pads, operatively connected to said row and column decoders, for providing one of input and output terminals to said semiconductor memory device, a number of said pads being connected to said sense amplifier; and
- line selection checking means, operatively connected to said cell matrix, for forming a logic gate circuit means including a plurality of transistors having gates respectively, operatively connected to one of said rows of word lines and columns of bit lines selected by said row and column decoders, and said line selection checking means including one of a voltage and current detection portion for detecting an output voltage of said line selection checking circuit.

18. A device according to claim 17, wherein said line selection checking means includes an output node, said device further comprising a switching transistor operatively connected between said output node and said sense amplifier.

* * * * *

UNITED STATES PATENT AND TRADEMARK OFFICE
CERTIFICATE OF CORRECTION

PATENT NO. : 4,720,818
DATED : January 19, 1988
INVENTOR(S) : TETSUJI TAKEGUCHI

It is certified that error appears in the above-identified patent and that said Letters Patent is hereby corrected as shown below:

Column 3, line 52, "$\overline{a})/$" should be --$\overline{a(i)}$--;
           line 55, after "become" insert --the--.

Column 4, line 18, "$\overline{a})/$" should be --$\overline{a(i)}$--;
           line 26, "$\overline{a})/$" should be --$\overline{a(i)}$--.

Column 5, line 23, "a" should be --an--.

Column 8, line 10, "signal" should be --signals--.

Column 6, line 19, after "series" insert --sequence--.

Signed and Sealed this

Twenty-eighth Day of June, 1988

Attest:

DONALD J. QUIGG

Attesting Officer      Commissioner of Patents and Trademarks

UNITED STATES PATENT AND TRADEMARK OFFICE
CERTIFICATE OF CORRECTION

PATENT NO. : 4,720,818
DATED : JANUARY 19, 1988
INVENTOR(S) : TETSUJI TAKEGUCHI

It is certified that error appears in the above-identified patent and that said Letters Patent is hereby corrected as shown below:

Col. 3, line 52, "$\bar{a})/$" should be --$\overline{a(i)}$--;

line 55, after "become" insert --the--.

Col. 4, line 18, "$\bar{a})/$" should be --$\overline{a(j)}$--;

line 26, "$\bar{a})/$" should be --$\overline{a(l)}$--.

Col. 5, line 23, "a" should be --an--.

Col. 6, line 19, after "series" insert --sequence--.

Col. 8, line 10, "signal" should be --signals--.

This Certificate supersedes Certion of Correction issued June 28, 1988.

Signed and Sealed this

Fourth Day of October, 1988

*Attest:*

DONALD J. QUIGG

*Attesting Officer*      *Commissioner of Patents and Trademarks*